United States Patent [19]
Bridgewater, Jr.

[11] Patent Number: 6,034,551
[45] Date of Patent: Mar. 7, 2000

[54] LOW VOLTAGE DIFFERENTIAL DUAL RECEIVER

[75] Inventor: Walter Francis Bridgewater, Jr., San Jose, Calif.

[73] Assignee: Adaptec, Inc., Milpitas, Calif.

[21] Appl. No.: 08/944,903

[22] Filed: Oct. 6, 1997

Related U.S. Application Data

[60] Provisional application No. 60/044,713, Apr. 18, 1997.

[51] Int. Cl.[7] .............................................. H03K 19/0175
[52] U.S. Cl. ................. 326/82; 326/86; 326/83; 326/30
[58] Field of Search ................... 326/86, 83, 82, 326/30, 21

[56] References Cited

U.S. PATENT DOCUMENTS

| | | | |
|---|---|---|---|
| 5,325,355 | 6/1994 | Oprescu et al. | 326/86 |
| 5,374,861 | 12/1994 | Kubista | 326/30 |
| 5,592,510 | 1/1997 | Brunt et al. | 375/220 |
| 5,880,599 | 3/1999 | Bruno | 326/56 |

*Primary Examiner*—Michael Tokar
*Assistant Examiner*—Daniel D. Chang
*Attorney, Agent, or Firm*—Martine, Penilla & Kim, LLP

[57] ABSTRACT

A low-voltage differential dual receiver for a SCSI bus uses a symmetrical driver by doing without a termination bias voltage. The data phase and protocol phase of SCSI communication are separated by using two receivers and optimizing each receiver for its particular function. A high-speed receiver is used when transmitting data at high-speeds, and a lower performance, low-speed receiver is used for other SCSI phases. A built-in offset allows the low-speed receiver to operate correctly during bus arbitration. The built-in offset in the low-speed receiver takes the place of the termination bias voltage in a traditional SCSI bus and is implemented in a variety of ways. In a first example, an N-well generation circuit produces a bulk voltage for one transistor of the differential transistor pair that is different than a supply voltage supplied to the bulk of the other transistor. In a second example, each of the transistors of the pair is implanted with a different dosage to change the threshold voltage for each. In a third example, resistors of different sizes are attached to the source of each transistor in the pair in order to produce a different voltage at each source. In a fourth example, two replica comparators are used to monitor an offset voltage of the differential receiver and to send control signals to an adjustable current source. The current source is adjusted by having an up-down counter switch on and off various legs of the current source.

10 Claims, 7 Drawing Sheets ns within a computer system. More specifically, the
LOW VOLTAGE DIFFERENTIAL DUAL RECEIVER This application claims priority of provisional application Ser. No. 60/044,713, filed Apr. 18, 1997, of the same title and inventor, and is related to U.S. patent application Ser. No. 08/944,336, filed on the same date herewith, entitled "Low Voltage Differential Driver with Multiple Drive Strengths", which is hereby incorporated by reference.

FIELD OF THE INVENTION

The present invention relates generally to data communications within a computer system. More specifically, the present invention relates to a differential receiver of a bus line.

BACKGROUND OF THE INVENTION

Within a computer system, it is often desirable to connect a variety of peripherals to the system bus of the computer itself for communication with the central processing unit and other devices connected to the computer. A variety of bus types may be used, and for any bus it is important to have bus drivers and bus receivers that allow devices to communicate quickly, efficiently and accurately.

FIG. 1 illustrates an embodiment of a computer system 10. Computer system 10 includes a computer 12, a disk drive 14, a tape drive 16, and any number of other peripherals 18 such as card reader units, voice input/output, displays, video input/output, scanners, etc. The computer and peripherals in this example are connected via a Small Computer System Interface (SCSI) bus 20, although a wide variety of other buses may also be used.

Any number of computers or hosts may be present in computer system 10 and be connected to SCSI bus 20. Each computer may also contain a variety of hardware and software. By way of example, computer 12 includes a monitor 30, a motherboard 32, a wide variety of processing hardware and software 34 and a SCSI host adapter card (or interface card) 36. Host adapter card 36 provides an interface between the microcomputer bus of computer 12 located on motherboard 32 and SCSI bus 20.

SCSI is a universal parallel interface standard for connecting disks and other high performance peripherals to microcomputers. However, it should be appreciated that computer system 10 is an example of a system, and other interface standards having characteristics similar to SCSI may also be used in such a computer system. By way of example, an Intelligent Peripheral Interface (IPI) standard is one such other standard.

In one embodiment, SCSI bus 20 is an 8-bit parallel flat cable interface (18 total signals) with hand shakes and protocols for handling multiple hosts and multiple peripherals. It has both a synchronous and an asynchronous mode, and has defined software protocols. In the embodiment shown, the SCSI bus uses differential drivers, although SCSI is also available with single wire drivers. SCSI interface cards (such as card 36) plug into most microcomputer buses including VME, Multibus I and II, PCI, ISA, VL, EISA and MCA. In another embodiment, SCSI bus 20 is a 16-bit parallel cable interface (27 total signals). In other embodiments motherboard 32 has SCSI adapter card 36 incorporated into the motherboard itself, and a separate, plug-in adapter card is not needed. SCSI bus 20 is a multi-drop bus typically produced as a flat cable that connects from a computer 12 to any number of peripherals. In this example, disk drive 14, tape drive 16, and other peripherals 18 connect to SCSI bus 20 by tapping into the bus. In other examples, it is possible for any number of peripherals to be inside computer 12 in which case SCSI bus 20 may also be present inside computer 12 also.

Disk drive 14 includes the physical disk drive unit 40 and SCSI controller card 42 and other internal cables and device level interfaces (not shown) for enabling the unit to communicate with computer 12. After connecting to disk drive 14, SCSI bus 20 continues on to connect to tape drive 16. Tape drive 16 includes the physical tape drive 50, SCSI controller card 52, and other internal cables and interfaces (not shown) for communicating with computer 12.

SCSI bus 20 also connects to any number of other peripherals 18. In alternative embodiments of the invention, any of the peripherals shown may eliminate the SCSI controller card by using an "embedded SCSI" architecture in which the SCSI bus becomes also the device level interface. In these peripherals, a cable such as SCSI bus 20 may be connected directly from motherboard 32 of a computer to a peripheral without the need for connecting to an internal controller card.

FIG. 2 shows in greater detail 50 SCSI bus 20 and connections to it from computer 12 and a peripheral 18. SCSI bus 20 may come in a variety of standards. Illustrated here by way of example, is a 16-bit SCSI bus with a variety of its control signals shown. Shown are the signals data[0] 52 through data[15] 54, parity 56, ACK (acknowledge) 58, REQ (request) 60, and a variety of other control signals 62.

This example illustrates how one value from computer 12 may be transferred via SCSI bus 20 to peripheral 18. It should be appreciated that any number of data or control signals may be transferred back and forth on the SCSI bus. For example, computer 12 has a value 70 that passes through a driver 72 and over an electrical connection 74 to the bus line data[15]. At the peripheral end, the signal on bus line data[15] is passed by way of an electrical connection 76 to a receiver 78 whereby value 70 is received in peripheral 18. Techniques by which a value may be transmitted by a driver over a SCSI bus to be received by a receiver in another electronic device are well known to those of skill in the art.

FIG. 3 shows in greater detail a proposed apparatus 80 by which value 70 is transmitted from computer 12 to peripheral 18. FIG. 3 illustrates a proposed SCSI standard known as the ULTRA 2 Specification being proposed by the SPI-2 working group. As in FIG. 2, FIG. 3 shows a value 70 being transmitted by a driver 72 from computer 12 to a receiver 78 in peripheral 18. Because SCSI bus 20 uses a voltage differential technique of transferring information, value 70 is transmitted using a signal line 82 from driver 72 and also using its complement, signal/84. In other words, signal lines 82 and 84 are used to transmit information for bus line data[15] 54. In a similar fashion, information for other bus lines is transmitted using two signal lines.

The SCSI bus also uses a bias voltage in the termination at each end of the SCSI bus. The termination bias voltage is used during the arbitration phase of SCSI protocol in order to help determine which devices are asserting which bits on the bus. Without a termination bias voltage, it would be difficult to determine which device is asserting a data bit because bits not being asserted would be floating. The need for a termination bias voltage on a SCSI bus and its ramifications are discussed in greater detail below. To achieve the termination bias voltage, computer 12 includes a voltage source V(A) 86 (for example, 1.5 volts) and a voltage source V(B) 88 (for example, 1.0 volt) which are connected in series using resistors 90 (for example, 270 ohms), resistor 92 (for example, 138 ohms), and resistor 94 (for example, 270 ohms). This termination bias voltage circuit is connected to signal lines 82 and 84 as shown. Thus, point 91 is typically at 1.3 volts due to the termination bias voltage, and point 93 is typically at 1.2 volts due to the termination bias voltage. The termination bias voltage also results in an approximate termination resistance of 110 ohms.

In a similar fashion, peripheral 18 also includes a termination bias voltage. As in computer 12, resistors 95, 96, and 97 connect in series voltages V(A) and V(B). These voltages and resistances may have similar values as for computer 12 and are connected to signal lines 82 and 84 as shown. Also shown in FIG. 3 are multiple bus taps 98 symbolizing the variety of other devices, computers, and peripherals that may also tap onto SCSI bus 50.

This proposed technique for transmitting data over a SCSI bus uses a low-voltage swing differential (LVD) driver and a low offset voltage, high-speed, differential input receiver. The driver for this type of SCSI bus uses an asymmetrical output, where one direction has more drive strength than the other. The reason for this asymmetrical output is because of the termination bias voltage as shown in FIG. 3.

Unfortunately, this termination bias voltage and the asymmetrical driver output that it necessitates can have undesirable effects. The reason for the need for a termination bias voltage has to do with the dual use of the data lines of a SCSI bus. A SCSI bus includes data lines that are used during a data phase of communication, i.e., high-speed transmission of data. A SCSI bus also includes various control lines that are used to transmit control signals at a lower speed during a protocol phase of communication on the bus. However, the data lines of a SCSI bus have a dual use. During the protocol phase of communication, the data lines are also used to transmit control signals used for arbitration on the bus. Thus, the data lines of a SCSI bus must be able to operate in a high-speed data phase and also in a low-speed protocol phase. Operation of these lines in the protocol phase requires a termination bias voltage.

The data lines have this dual use because of the way peripherals indicate when they wish to use the SCSI bus. When a peripheral on a SCSI bus wishes to use the bus, it asserts one of the data lines. Each peripheral on the bus is associated with one of the data lines, thus it can be determined which peripheral wants to use the bus by which data line is being asserted. However, when one peripheral is asserting one data line, the other data signals must be driven to a known state so that the SCSI bus and its attached devices can determine which data line is being asserted. In other words, if the data lines are simply floated it would be difficult to determine which of many data lines is being asserted.

Therefore, pull-up voltages are used at each end of the SCSI bus so that any non-driven data lines are put into a negated state. Thus, when one peripheral asserts one data line, all of the other data lines will be in a negated state and it may then be determined which peripheral wishes to use the bus. These pull-up voltages are called termination bias voltages and are due to the dual use of the data lines of a SCSI bus. A termination bias 30 voltage is present at each end of a SCSI bus and is used with single-ended drivers and also with differential drivers. Because of the termination bias voltages on a SCSI bus, the drivers must be asymmetrical, as will now be explained.

The need for an asymmetrical driver when a termination bias voltage is present may be seen by referring to FIG. 3.

As described above, a termination bias voltage produces a difference of about 100 mV between the two signal lines 82 and 84. Thus, in order to achieve a 500 mV voltage swing for negating a signal, only 400 mV need be driven because of the 100 mV difference already present. However, when asserting a signal, the driver must drive 600 mV in order to achieve a 500 mV voltage swing in order to overcome the already present 100 mV. Thus, a driver must drive asymmetrically in order to negate or assert a signal when a termination bias voltage is present.

Asymmetrical drivers produce a number of problems. For one, the drivers must match the termination bias voltage which may be inaccurate. For example, if voltage source V(A) or any of resistors 95, 96 or 97 are out of tolerance, then there may not be exactly 100 mV differential between signals 82 and 84. A driver expecting an exact termination bias voltage of 100 mV may experience problems when driving asymmetrically if a particular expected termination bias voltage is out of tolerance. A symmetrical driver is thus desirable because there is no termination bias voltage, and thus, no such mismatch problems. Additionally, data can be transmitted at much higher speeds if symmetrical drivers are used. Furthermore, a symmetrical driver achieves a better signal to noise ratio. Therefore, because of the nature of a SCSI bus, the asymmetrical drivers used often cause difficulties. Of course, other buses using asymmetrical drivers for a variety of reasons may also experience the drawbacks associated with these drivers. The IEEE standard 1394 attempts to solve some of these problems, but does so only for a serial interface. IEEE-1394 is the industry-standard implementation of Apple Computer, Inc.'s FIREWIRE digital I/O system.

Another problem associated with a SCSI bus is the use of high-voltage differential drivers. A high-voltage driver may have a voltage differential of about 2.5 volts minimum, whereas a low-voltage differential driver may have a differential from about 260 mV to 780 mV. Because of the higher power required with a high-voltage driver, power dissipation is an issue and two or three integrated circuits may be needed to implement a SCSI interface. In other words, not all of the bus signals can be implemented on one chip because of power concerns, so more chips are needed to help dissipate the power. Unfortunately, the use of more than one chip to implement a SCSI interface leads to mismatch and timing skew between the chips. On the other hand, the use of low-voltage differential drivers saves power and allows all drivers and/or receivers for a SCSI bus to be integrated on one chip. Having all drivers or receivers on one chip avoids mismatch and skew problems and is simpler to integrate into a greater circuit.

Therefore, it would be desirable to have a receiver apparatus for a bus that allows high-speed data transmission to occur using a symmetrical driver, yet still allow arbitration on a bus to occur in the standard fashion. It would also be desirable for such a receiver to have excellent signal to noise margins for transmitting data at high-speeds and to conserve power.

SUMMARY OF THE INVENTION

To achieve the foregoing, and in accordance with the purpose of the present invention, a low-voltage differential dual receiver for a bus is proposed that allows for symmetrical drivers by doing without a termination bias voltage. A high-speed receiver is used when transmitting data at high-speeds, and a lower performance, low-speed receiver is used for other bus phases.

The present invention separates the data phase and protocol phase of bus communication by using two receivers and optimizing each receiver for its particular function. The dual receiver includes a high-speed symmetrical receiver providing a high-speed symmetrical data path during the data phase of communication, and a low-speed receiver for the protocol phase having a built-in offset. The built-in offset allows the low-speed receiver to operate correctly during bus arbitration or SCAM. The built-in offset in the low-speed receiver takes the place of the termination bias voltage present in an asymmetrical bus. Incorporation of the built-in offset in the low-speed receiver allows the high-speed receiver to be driven symmetrically at higher speeds.

In a first embodiment of the built-in offset, a generation circuit produces a bulk voltage for one transistor of the differential transistor pair that is different than a supply voltage supplied to the bulk of the other transistor. In a second embodiment, each of the transistors of the pair is implanted with a different dosage to change the threshold voltage for each. In a third embodiment, resistors of different sizes are attached to the source of each transistor in the pair in order to produce a different voltage at each source. In a fourth embodiment, two replica comparators are used to monitor an offset voltage of the differential receiver and to send control signals to an adjustable current source. The current source is adjusted by having an up-down counter switch on and off various legs of the current source.

Advantageously, the high-speed and low-speed bus phases are separated so that a user can have the best of both worlds. Because the termination bias voltage is eliminated from the bus, data transmission may take place at high-speed using a symmetrical driver communicating with the high-speed receiver. This high-speed communication takes place without the drawbacks of asymmetrical communication. The low-speed receiver then handles the protocol phase of bus communication where a built-in offset is needed. This built-in offset may be implemented in a variety of ways depending upon integrated circuit process and design constraints. Additionally, use of a low-voltage differential driver allows a complete bus interface (including drivers and receivers for each bus line) to be integrated onto one chip, thus reducing mismatch and skew problems and saving power.

Additionally, by separating the data and protocol phases into two receivers, a more workable design results. A separate symmetrical high-speed data receiver is simpler to design and does not need an internal offset. Although a single receiver with a built-in offset could be used for both data and protocol communication, it is extremely difficult to design such a receiver to also operate at high speed for data communication. It is simpler to design one receiver with a built-in offset for operation at low speed in a protocol phase, and another receiver for operation at high speed in a data phase. Thus, having two separate receivers results in a simpler design that still achieves a purpose of allowing for high-speed symmetrical data communication.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention uses low-voltage differential signaling with a symmetrical driver and a dual receiver in order to provide for high-speed data communication and low-speed protocol communication. A high-speed receiver is used for data, and a low-speed receiver with a built-in offset is used for protocol information.

Parallel data buses such as a SCSI bus may experience a so-called "first pulse problem" where a first changing pulse after a constant signal experiences attenuation of the signal and an extremely low voltage differential. One technique for remedying the first pulse problem is discussed in U.S. patent application Ser. No. 08/944,336 referenced above.

Embodiments of the present invention do without a termination bias voltage, and instead use a built-in offset within the low-speed receiver to allow the low-speed receiver to operate correctly during bus arbitration. Such a low-speed receiver with a built-in offset is coupled with a high-speed receiver to receive information from a symmetrical driver over a bus line.

Figure 1:
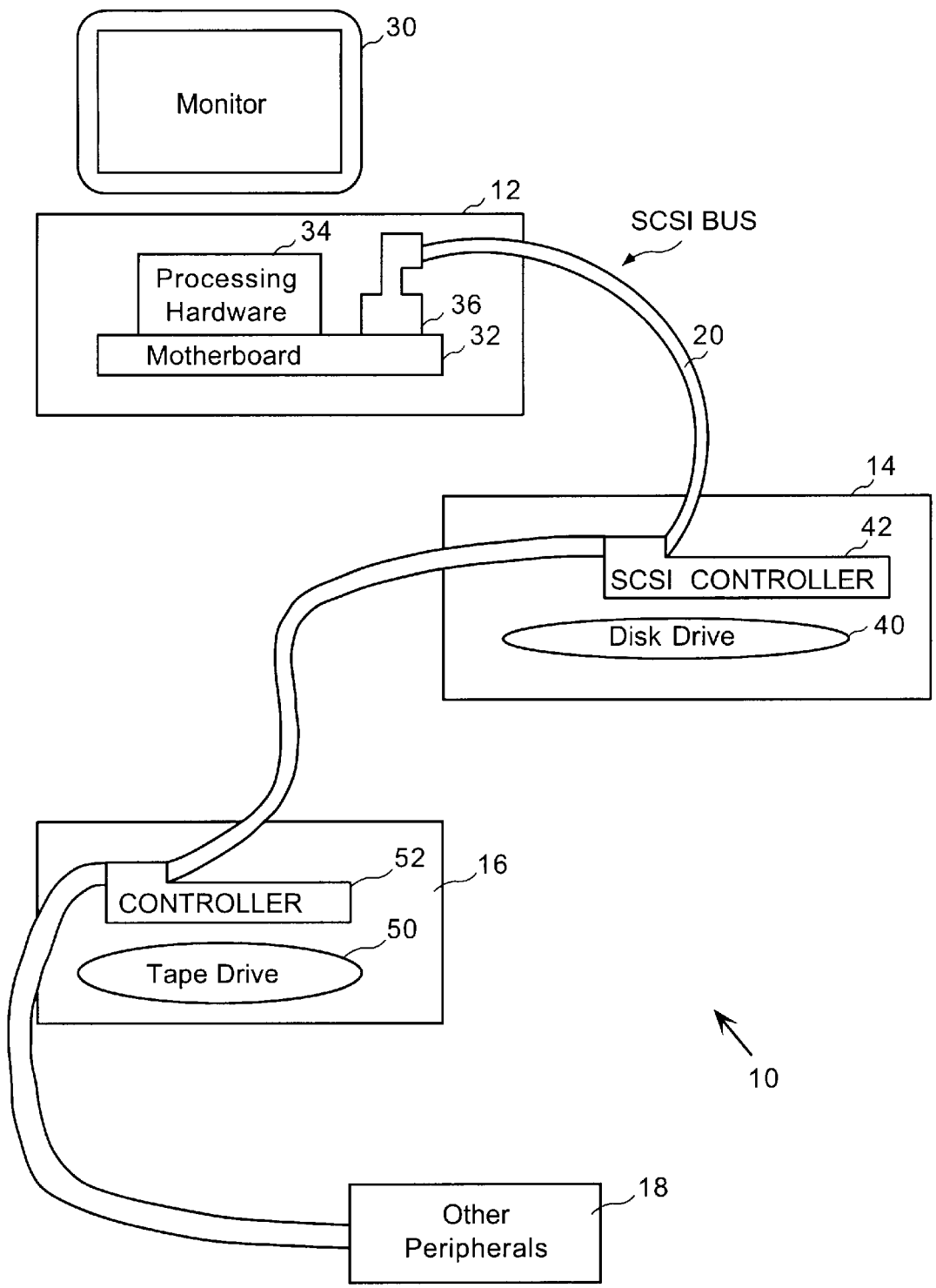
FIG. 1 illustrates a computer system in which an embodiment of the present invention may be used.
Figure 2:
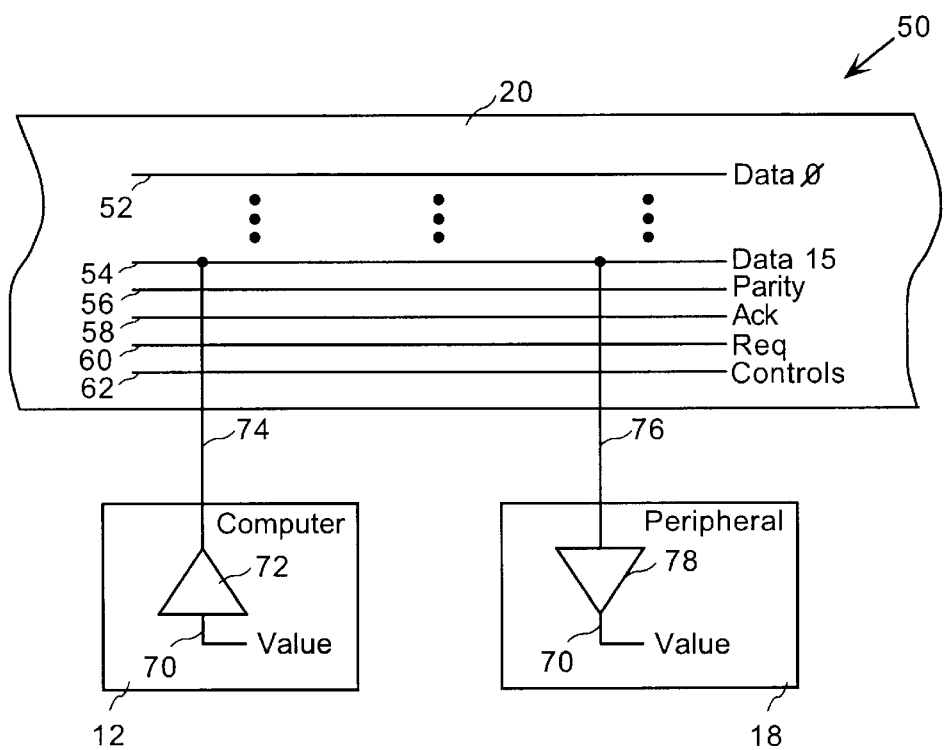
FIG. 2 illustrates in greater detail the SCSI bus from FIG. 1 and its connections to a computer and a peripheral.
Figure 3:
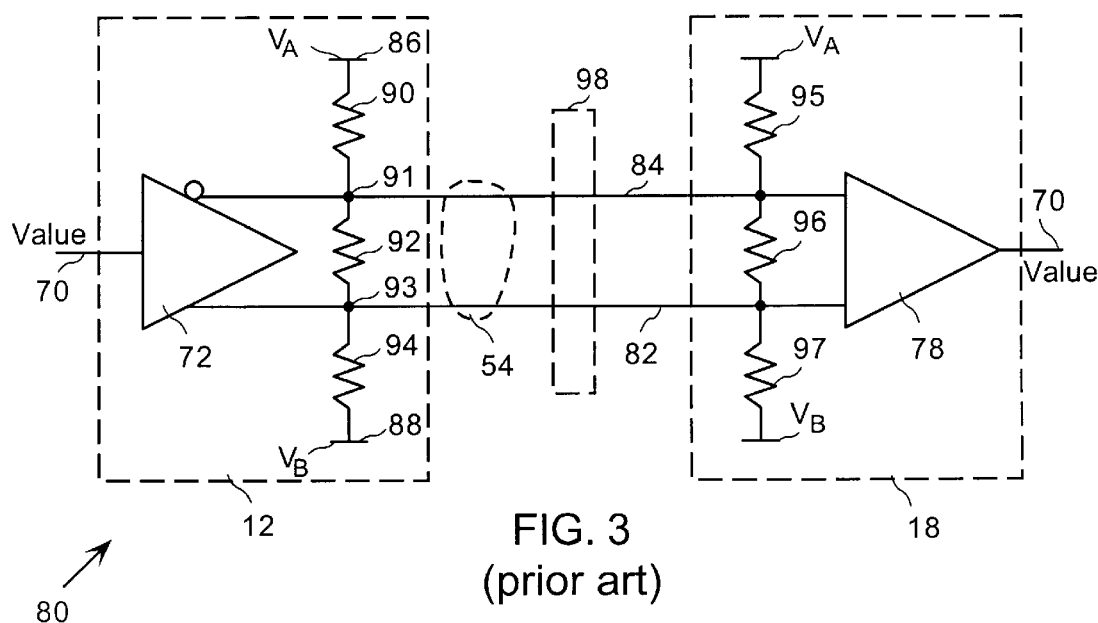
FIG. 3 illustrates in greater detail a data line from the SCSI bus of FIG. 2 and an associated driver and receiver.
Figure 4:
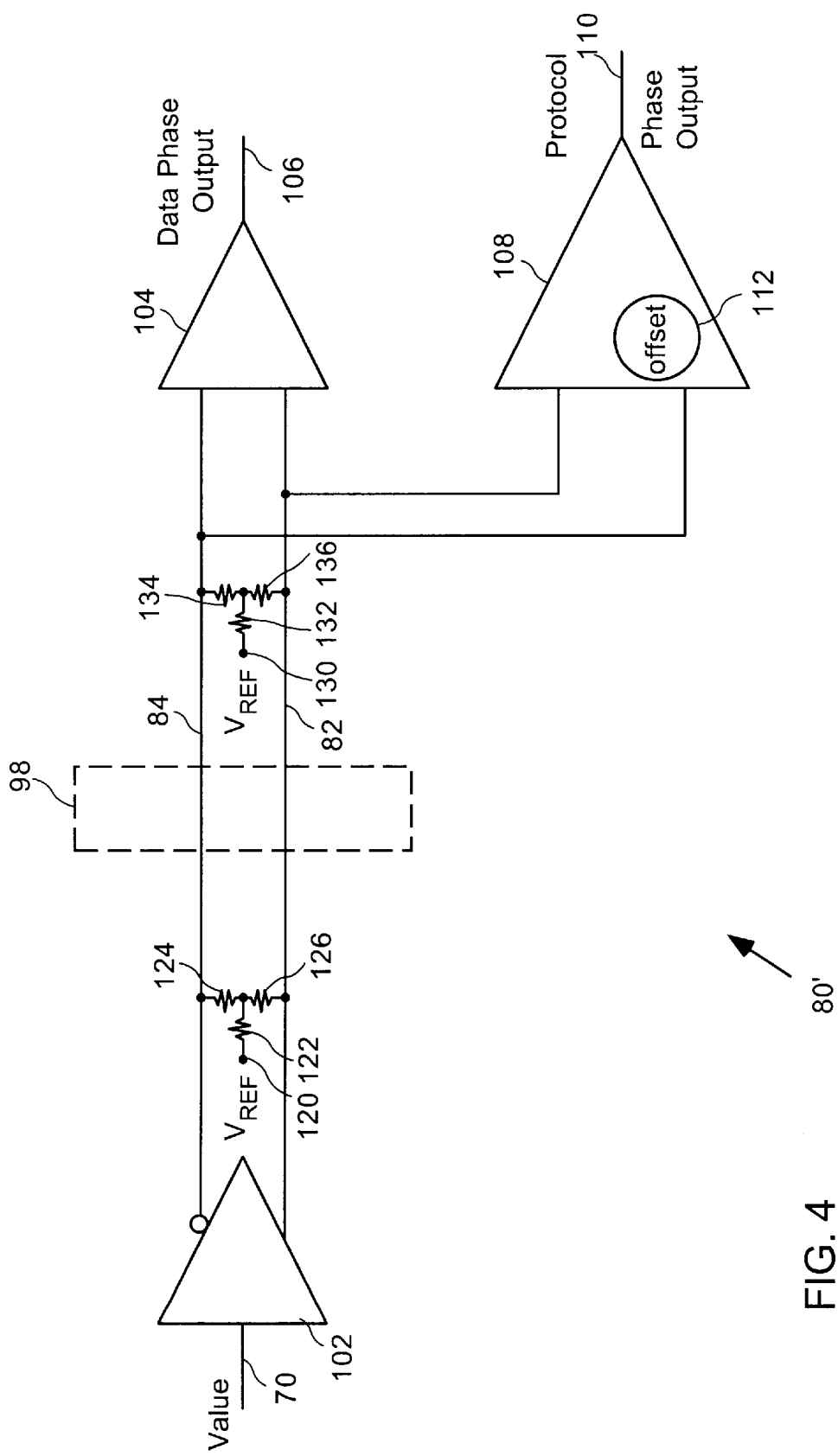
FIG. 4 is a circuit having a dual receiver for communicating over a bus according to one embodiment of the present invention.
Figure 5:
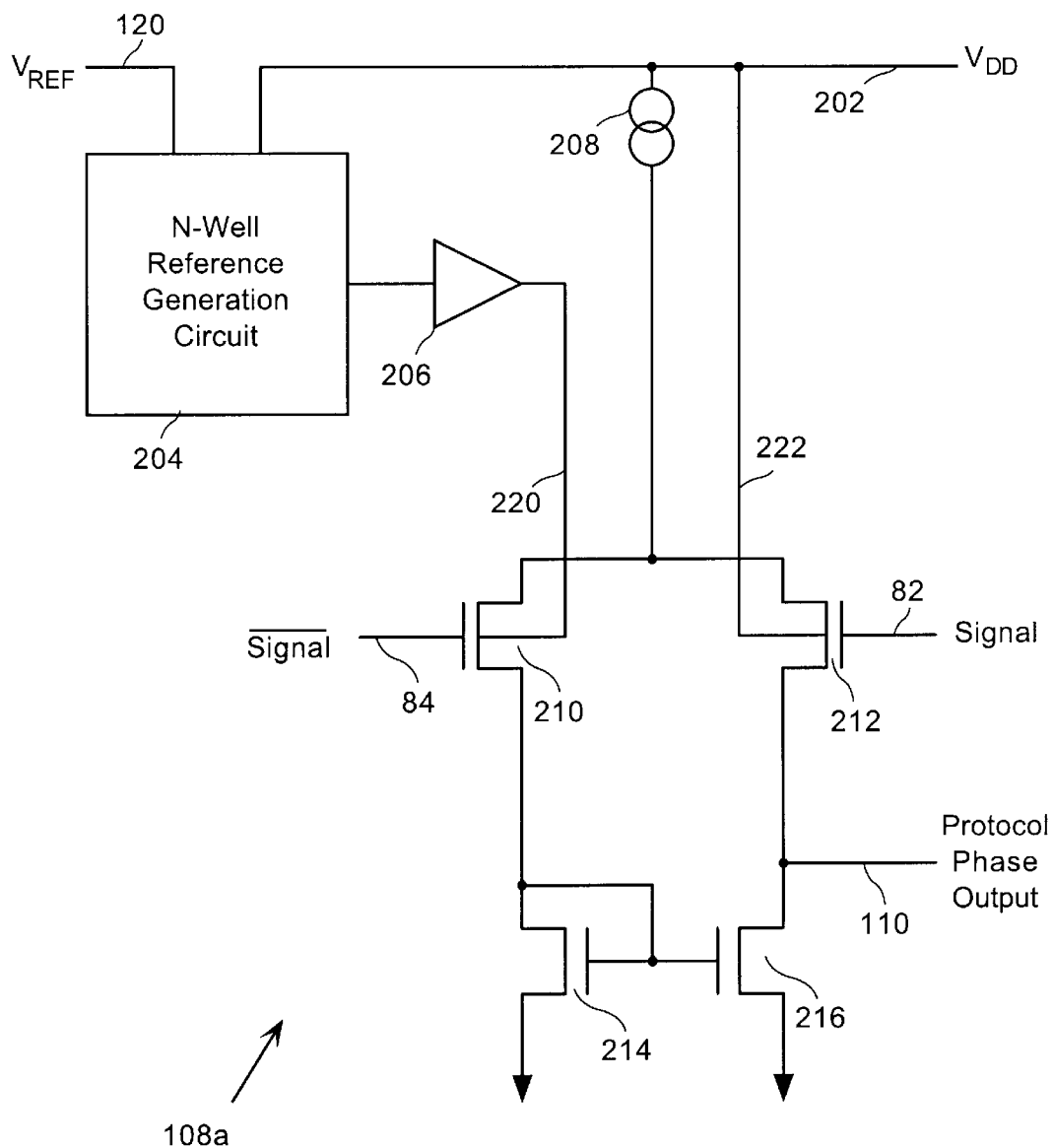
FIG. 5 is a circuit illustrating one embodiment of the low-speed receiver of FIG. 4.

FIG. 4 shows an improved apparatus 80' by which value 70 is transmitted from a computer to a peripheral, for example. Value 70 is transmitted by a symmetrical driver 102 over signal lines 82 and 84 to a low offset voltage, high-speed differential input receiver 104 (when data is transmitted) that produces a data phase output 106. If value 70 represents information during a protocol phase, then value 70 is received by a low-speed receiver 108 that produces a protocol phase output 110. Driver 102 is a symmetrical driver that does not need to operate asymmetrically because no termination bias voltage is present on signal lines 82 and 84. Thus, driver 102 may operate at a high-speed and also save power. Receiver 108 includes a built-in offset that allows the receiver to operate correctly during bus arbitration or SCAM. Built-in offset 112 takes the place of the termination bias voltage such as is seen in the apparatus of FIG. 3. By separating the data and protocol phases into two receivers, each receiver may be optimized for its particular function.

Any number of such drivers 102 and receivers 104 and 108 may be present within an integrated circuit that functions as a bus interface. That is, such a bus interface chip may have a symmetrical driver 102 and receivers 104 and 108 for each line of the bus. Such a bus line would have no termination bias voltage. By way of example, for a 16-bit SCSI bus, such a bus interface chip would include 16 such drivers and 16 pairs of receivers 104 and 108 for the data lines of the bus. Other such drivers and receivers may also be added for other lines as needed.

A common mode reference voltage, V(REF) 120 connects to resistors 122, 124, and 126, which in turn connect to signal lines 82 and 84 as shown. This common mode reference voltage is used because driver 102 is not a perfect driver. Even with symmetrical drivers, an imbalance or timing skew exists between drivers. Due to this imbalance, various error currents are present at times flowing through the differential lines. The common mode reference voltage provides a location where the error currents may dissipate. It also provides a common mode voltage point for other receivers also. A common mode reference voltage of about 1.2 volts works well, with resistor 122 being in the range from 100 to 300 ohms, and resistors 124 and 126 being approximately 55 ohms. At the other end of the bus, common mode reference voltage V(REF) 130 connects to resistors 132, 134, and 126, which in turn connect to signal lines 82 and 84 as shown. Values for this voltage and for these resistors are preferably similar to those previously mentioned.

Receiver 104 may be the same as receiver 78 of FIG. 3. Receiver 104 is used for the high-speed data phase and communicates symmetrically with driver 102. No offset is needed within receiver 104 because no offset is required on the SCSI bus during the data phase of communication. Typically, a speed of 40 MHz may be used in the data phase for receiver 104, although higher or lower speeds may also be used. Receiver 108 is also a differential input receiver and operates at lower speeds. Protocol phase communication typically takes place asynchronously at about 5 MHz, the speed being limited by cable propagation delay. Receiver 108 contains a built-in offset 112 in order to allow correct operation during the protocol phase when the signal lines are not floated. Offset 112 takes the place of the termination bias voltage. Various embodiments for implementing this offset are discussed below in FIGS. 5–9.

During SCSI bus communication, a receiving device is aware of which phase is taking place and is thus able to choose either output 106 or output 110 for receiving the information it needs. Alternatively, data phase output 106 may be directed to a FIFO buffer where data is to be retrieved, and protocol phase output 110 may be directed to a phase control engine. In this fashion, a receiving device is able to correctly retrieve the information it needs from the SCSI bus for either phase.

Apparatus 80' works well with a variety of lines of a SCSI bus. By way of example, apparatus 80' having receiver 104 and receiver 108 works particularly well with the data lines of an SCSI because these data lines serve a dual purpose. That is, the data lines are used during a data phase for high-speed data communication, and are also used during a protocol phase for lower speed arbitration. Thus, apparatus 80' with its dual receivers works particularly well with data lines on an SCSI bus. Dual receiver apparatus 80' may also be useful with the parity, acknowledge and request control lines of an SCSI bus, although these control lines may only need a high-speed receiver. Of course, other lines in a variety of buses that serve a dual purpose can also benefit from dual receiver apparatus 80'.

Receiver 108 with built-in offset 112 may be implemented in wide variety of manners. By way of example, receiver 108 may be implemented as illustrated in receiver 108*a* of FIG. 5. Receiver 108*a* provides a difference between the bulk voltages of the first input differential transistor pair, thus creating a threshold difference between these transistors that then creates the offset. Receiver 108*a* accepts input signals 82 and 84, common mode reference voltage V(REF) 120, voltage V(dd) 202 and produces protocol phase output 110.

The receiver includes an N-well reference generation circuit 204, a buffer amplifier or voltage follower 206, a bias current source 208, a differential pair of transistors 210 and 212, and current mirrors 214 and 216.

In operation, generation circuit 204 uses input voltages 120 and 202 to determine a voltage to be applied to the bulk 220 of transistor 210. As will be appreciated by those of skill in the art, generation of a bulk voltage 220 that is different from voltage 202 may be achieved using a variety of techniques. Voltage source 202 supplies a voltage to the bulk 222 of transistor 212. Thus, there is a difference between the bulk voltages 220 and 222 of transistors 210 and 212, resulting in a threshold difference between the two transistors. Thus, through the use of differing bulk voltages, a built-in offset can be achieved for receiver 108*a*.

Current source 208 supplies current to the differential pair, and works well with a value of about 50 uA. Current mirrors 214 and 216 are typical current load transistors for differential pair 210 and 212. Output 110 may also be input to a next receiver stage for amplification. Receiver 208*a* and its transistors may be implemented using a variety of techniques and processes. By way of example, in one embodiment of the invention transistors 210–216 are p-channel transistors formed in an N-well of a semiconductor.

In an alternative embodiment, a pair of resistors may be added to the sources of the first input differential transistor pair. There would be one resistor for each transistor. The resistors are of different values, such that for a given bias current for the input receiver, there is a difference in the voltage drop across the resistors which provides the desired offset voltage. Because resistor matching works well within an integrated circuit, a similar resistor can be used to create the bias current circuit for the receiver. The tolerance of the built-in offset is fairly large, being about 130 mV +/−45 mV. With this large a tolerance, the power supply voltage could also be used for a voltage reference in designing a receiver with the desired built-in offset voltage.

Figure 6:
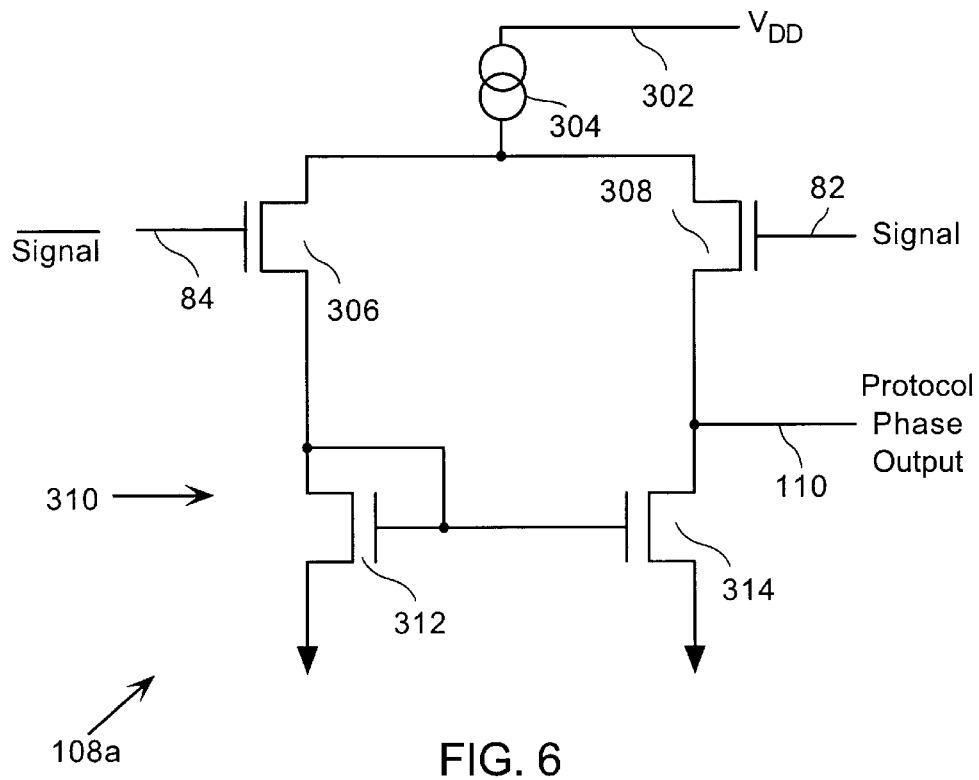
FIG. 6 is a circuit illustrating another embodiment of the low-speed receiver of FIG. 4.
Figure 7:
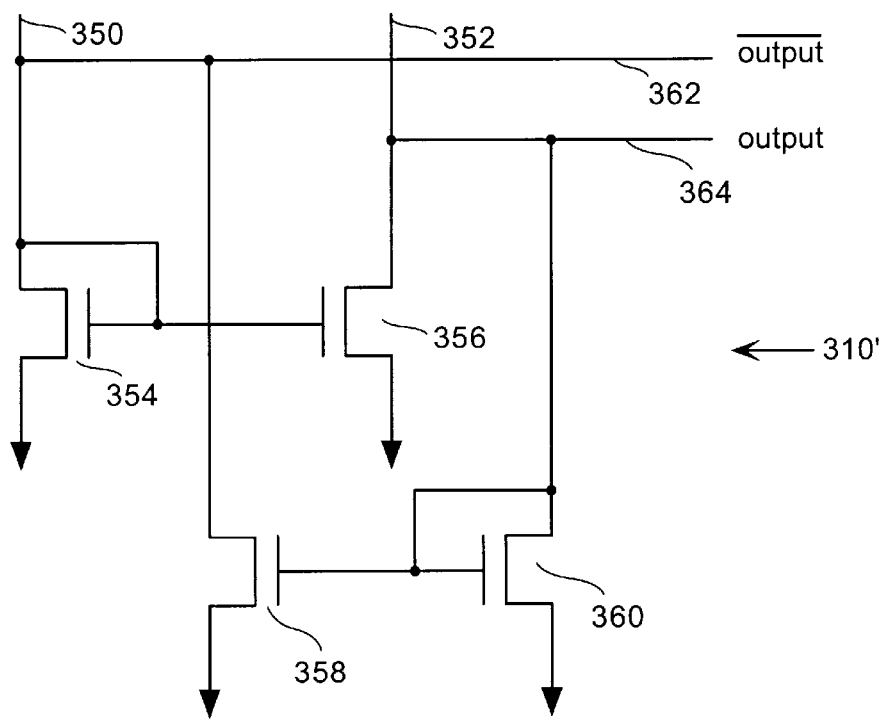
FIG. 7 is a circuit illustrating an alternative technique for implementing load transistors suitable with various embodiments of the present invention.

FIG. 6 illustrates an alternative embodiment for receiver 108 in which it is implemented as receiver 108*b*. Using this technique, different voltage thresholds for each of the differential pair of transistors may be obtained by adjusting the implant dosage in the semiconductor material. Thus, the threshold for each of the transistors may be controlled by changing the implant dosage for the source, drain or gate, etc. This threshold difference produces a built-in offset. The threshold voltage may be changed in a variety of other ways also related to semiconductor processing. By way of example, an extra implant step may be added, or the process may be altered by changing one of the masks. In one embodiment, differential transistors having a threshold difference of about 130 mV are created by adding an extra process step to modify the implant dosage.

Receiver 108*b* accepts signals 82 and 84 as inputs to produce protocol phase output 110. Receiver 108*b* uses a voltage source 302 connected to a bias current source 304 to supply differential input pair transistors 306 and 308. Transistors 306 and 308 have been formed using different implant dosages such that there is a threshold difference between the two of them. Load transistors 310 include a transistor 312 and a transistor 314. In one embodiment of the invention, transistors 306 and 308 are p-channel transistors, and transistors 312 and 314 are n-channel transistors. Thus, the differential receiver circuit of FIG. 6 achieves a built-in offset by modifying the process to produce a threshold difference between transistors 306 and 308.

In an alternative embodiment to FIG. 6, the same effect may be realized by controlling the back bias voltages for the N-well. By building a p-channel differential pair where each transistor has its own N-well, the threshold voltage difference of the transistors may be adjusted by using different back bias voltages on each N-well. Other similar techniques may also be used to create a voltage threshold difference.

It should be appreciated that load resistors 310 may be implemented in a wide variety of manners. By way of example, in a preferred embodiment, load transistors 310 are implemented as shown in circuit 310' of FIG. 7. Load transistor circuit 310' accepts as input signals 350 and 352 originating from transistors 306 and 308, and produces output signals 362 and 364. In this way, circuit 310' produces a differential output to drive a next stage of the receiver, instead of merely producing a single-ended output. Circuit 310' includes transistors 354 and 356 as well as a replicated pair of transistors 358 and 360. In a particular embodiment of circuit 310', each of the transistors is an n-channel transistor. It should be appreciated that p-channel transistors could also be used as will be appreciated by one of skill in the art.

Figure 8:
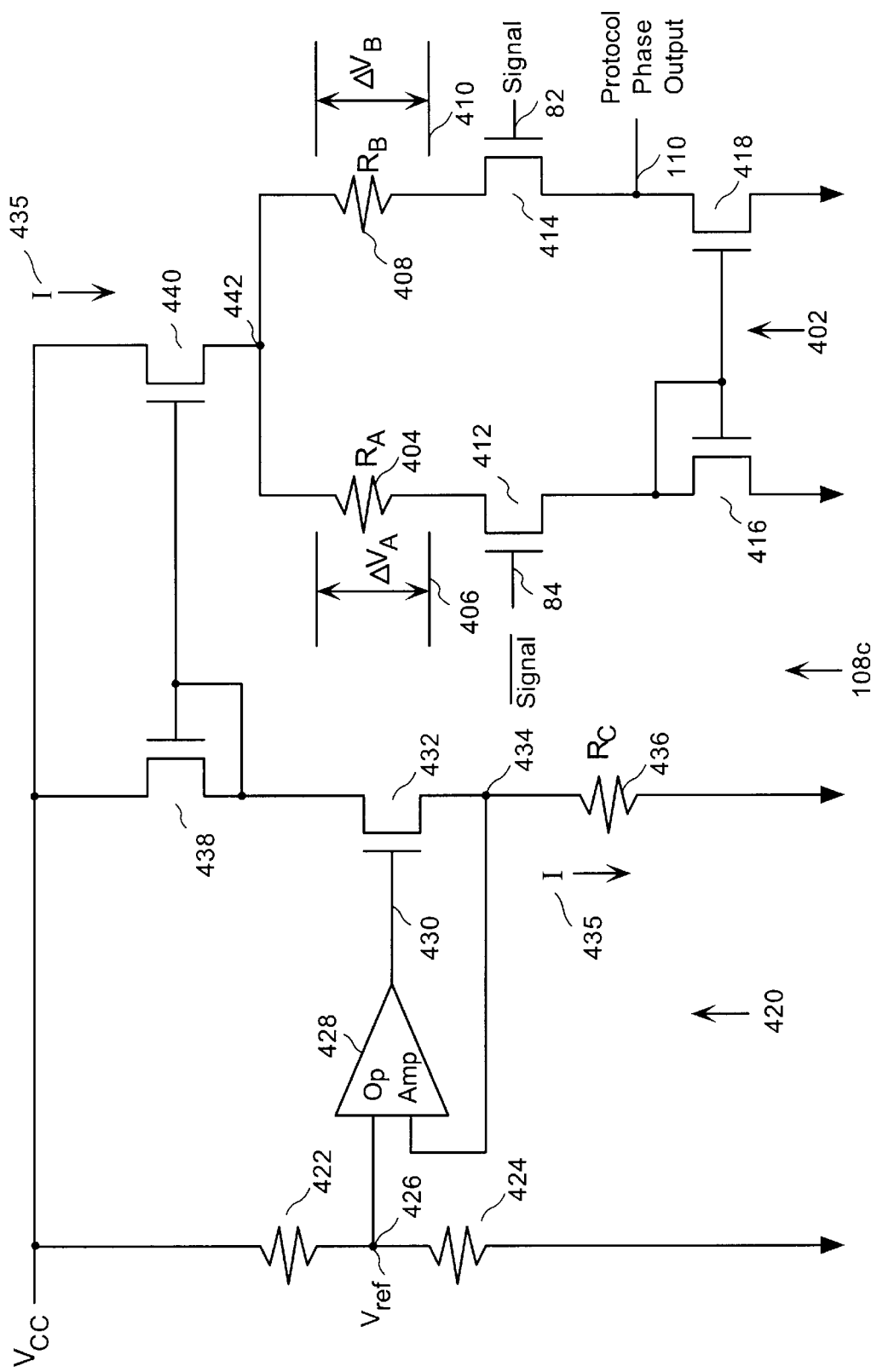
FIG. 8 is a circuit illustrating yet another embodiment of the low-speed receiver of FIG. 4.

In another embodiment of receiver 108, a receiver 108c is implemented as shown in FIG. 8. In this embodiment, a voltage offset for the pair of differential transistors is achieved by connecting resistors of different sizes to each of the sources of the differential transistor pair, thus creating a different voltage drop and a different voltage at the source of each transistor. This embodiment makes use of the fact that although it may be difficult to match a resistor to an absolute value within an integrated circuit, resistors may be matched to one another within an integrated circuit fairly accurately.

Receiver 108c receives as input signals 82 and 84 and produces a protocol phase output 110. Receiver 108c includes a differential receiver 402 having a resistor R(A) 404 creating a particular voltage drop $\Delta V(A)$ 406, and a resistor R(B) 408 creating a different voltage drop $\Delta V(B)$ 410. Respectively, these differing voltage drops are seen at the sources of transistors 412 and 414. Differential receiver 402 also includes load transistors 416 and 418.

Receiver 108c also includes a current matching circuit 420 that includes resistors 422 and 424 connected in series to a reference voltage V(cc) in order to produce a desired reference voltage V(ref) 426. This reference voltage V(ref) 426 serves as one input to operational amplifier 428. The output 430 of this amplifier connects to transistor 432 as shown. The voltage at point 434 is forced by amplifier 428 to be the same as voltage V(ref) 426, and a particular current I 435 is created by the voltage drop from point 434 through resistor R(C) 436 to ground. Transistors 438 and 440 are provided for switching and to allow current I 435 to also flow from reference voltage V(cc) through point 442 and into differential receiver 402.

The operation of receiver 108c will now be described. By using resistors 404 and 408 of different sizes, a different voltage drop over each is produced, thus providing an offset for differential receiver 402. For example, assuming that current I 435 is about 100 uA, then a difference in resistance values between resistor 404 and 408 of about 1.3k ohms yields a voltage difference between voltage drops 406 and 410 of about 130 mV. An offset of about 130 mV +/−30 mV works well in this situation and is appropriate on a low-voltage differential bus where the minimal signal swing is about 260 mV. To achieve a desired voltage difference between voltage drop 406 and voltage drop 410, a current matching circuit 420 may be implemented as follows.

Voltage V(cc) is a voltage with a tolerance of about 5% or better. In one example, resistors 422 and 424 are adjusted in size to achieve a reference voltage V(ref) 426 of about 130 mV. As point 434 is connected as an input to operational amplifier 428, the operational amplifier will try to force the voltage at point 434 to be the same as the voltage at V(ref) 426. Thus, the voltage at point 434 will also be approximately 130 mV, which creates a voltage drop of 130 mV through resistor 436. Thus, current I 435 flowing through resistor 436 is the current needed to produce a 130 mV drop for a resistor of the size of resistor R(C) 436.

Because of the way receiver 108c is designed, this same current I 435 also passes through point 442 and into differential receiver 402. Thus, each of resistors 404 and 408 also see the same current as resistor 436. Each would produce the same voltage drop of 130 mV if each were of the same size as resistor 436. However, in order to achieve an offset voltage of 130 mV, it is preferred to design resistor R(A) 404 such that it is four times the size of resistor R(C) 436, and to design resistor R(B) 408 such that it is five times the size of resistor R(C) 436. Thus, because resistor 408 is one value of resistor 436 larger than resistor 404, there will be a 130 mV voltage drop difference between the voltage drops 406 and 410. This difference in voltage drops produces a built-in offset. In this fashion, resistors 404, 408 and 436 may be made of the same type material and need not be matched to an absolute value, but need only be matched relative to each other.

In an alternative embodiment, resistor 404 is not used and resistor 408 is adjusted in size to create a voltage drop of about 130 mV. However, having only one such resistor may lead to hysteresis in the differential receiver. In order to avoid this hysteresis, it is preferred to use both resistors 404 and 408. Receiver 108c may be implemented using differing types of transistors. By way of example, in one embodiment of the invention transistors 412, 414, 438 and 440 are all p-channel transistors. Transistor 432 may be a p or n-channel transistor, and load transistors 416 and 418 are n-channel transistors.

Figure 9:
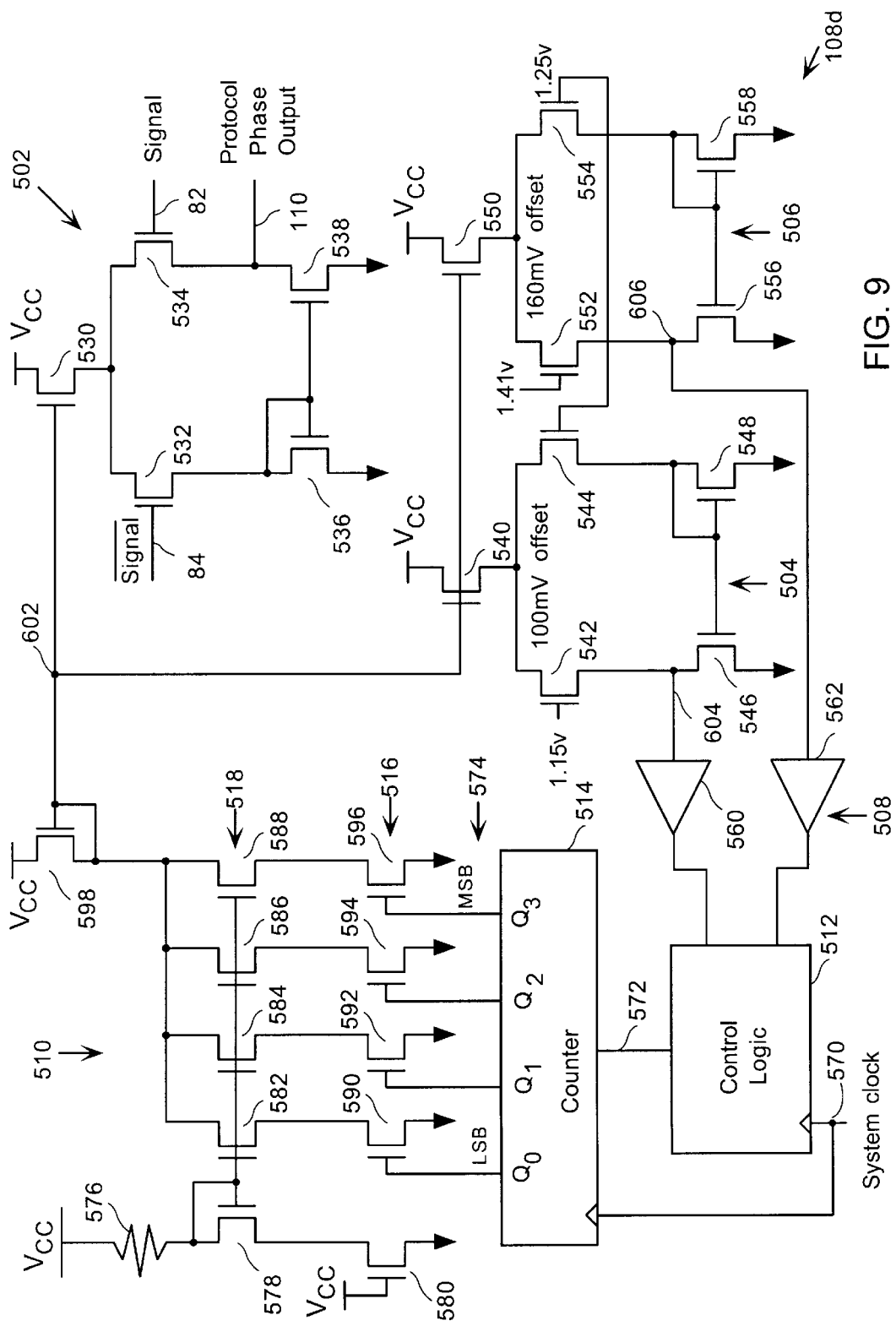
FIG. 9 is a circuit illustrating yet another embodiment of the low-speed receiver of FIG. 4.

FIG. 9 illustrates another embodiment 108d of receiver 108 of FIG. 4. Receiver 108d is a preferred embodiment at the 0.6 micron level. At the 0.35 micron level, receiver 108b of FIG. 6 is a preferred embodiment as long as process changes may be made with minimum impact. This embodiment of FIG. 9 uses a replica biasing scheme in order to achieve a built-in offset of 130 mV. Normally, a differential pair of transistors with no desired offset have the same geometric sizes. However, in order to achieve an offset in this embodiment, each transistor of the differential pair is geometrically drawn at a different size (by modifying a mask) in order to produce a pair of transistors that will have a voltage offset. In other words, because current flowing through the differential receiver will be the same for each transistor, having transistors of different geometric sizes produces an offset.

However, only at a particular process corner will a desired offset voltage of 130 mV result. In other words, variations in the process, as well as temperature and current differences will have an affect on the actual offset voltage between the differential pair of transistors. In order to achieve a desired offset using transistors of different geometric sizes, and adjustable bias current is used. This adjustable bias current is adjusted upward or downward by receiver 108d in order to achieve the desired offset voltage.

This replica biasing scheme uses two replicated input receivers and digital control logic. A voltage of 130 mV plus some tolerance voltage is applied to one replicated input receiver and a voltage of 130 mV minus the same tolerance voltage is applied to the other replicated input receiver. The adjustable bias current is then used to bias the two replicated receivers, as well as the true differential receiver. Feedback from each of the replicated receivers is fed to digital control logic that then increases or decreases the bias current in order to achieve the desired offset. In this embodiment, outputs from each of the replicated receivers are assigned such that they indicate when the true differential receiver has about a 130 mV offset.

Receiver 108*d* accepts signals 82 and 84 in order to produce a protocol phase output 110. Receiver 108*d* includes a differential receiver 502, a first replicated receiver 504 and a second replicated receiver 506. Output from these replicated receivers are fed into gain stages 508 that are used as input for bias current control circuit 510. Bias current control circuit 510 includes control logic 512, a counter 514 that switches transistor 516 and transistors 518.

Differential receiver 502 receives the adjustable bias current through transistor 530 that is connected to V(cc). Receiver 502 includes transistors 532 and 534, as well as load transistors 536 and 538. As explained above, transistors 532 and 534 have different geometric sizes in order to produce an offset between the two transistors. By adjusting the bias current flowing into receiver 502, a desired offset voltage for receiver 502 can be achieved.

Replicated receiver 504 functions as a replica comparator and trips and sets an output signal 604 when its offset goes below 100 mV. This output signal is used by bias current control circuit 510 in order to increase the bias current. Receiver 504 receives current through transistor 540 that is connected to V(cc). Receiver 504 includes transistors 542 and 544 having the same dimensions as transistors 532 and 534, as well as load transistors 546 and 548. The gate of transistor 542 is connected to 1.15 volts while the gate of transistor 544 is connected to 1.25 volts, producing a 100 mV offset for receiver 504.

Replicated receiver 506 functions in a similar manner to receiver 504. Receiver 506 also functions as a replica comparator and trips and sets an output signal 606 when its offset goes above 160 mV. This output signal is used by bias current control circuit 510 in order to increase the bias current. Receiver 506 receives current through transistor 550 that is also connected to V(cc). Receiver 506 includes transistors 552 and 554 having the same dimensions as transistors 532 and 534, as well as load transistors 556 and 558. The gate of transistor 552 is connected to 1.41 volts while the gate of transistor 554 is connected to 1.25 volts, producing a 160 mV offset for receiver 504.

The control outputs 604 and 606 from receivers 504 and 506 are fed through additional gain stages 560 and 562, respectively, and into control logic 512. Control logic 512 uses a system clock input 570 and produces control signal 572 for controlling the operation of counter 514. When receiving a control signal from receiver 504, control logic 512 operates to increase counter 514, thus increasing the bias current. When receiving a signal from receiver 506, the control logic operates to reduce the counter in order to reduce the bias current.

Counter 514 has any number of outputs 574 used to adjust the bias current within bias current control circuit 510. By way of example, in this embodiment a four-bit counter having outputs Q0, Q1, Q2 and Q3 is used. Bias current control circuit 510 also includes a resistor 576 connected to V(cc), and transistors 578 and 580. In this example, there are four controllable legs in the adjustable bias current, although any number of legs are possible. In this example, legs one through four include transistors 582–588 which in this embodiment are n-channel transistors and are turned on via a positive voltage from V(cc). Transistors 590–596 of legs one through four are also n-channel transistors and are switched on by counter 514. Transistor 598 is also connected to V(cc). The adjustable bias current flowing through legs one through four also flows into each of the three receivers through point 602. Thus, each of the three receivers receives the same adjustable bias current.

In operation, if the bias current at point 602 is such that less than a 100 mV offset is present in the different size transistors of receiver 502, then receiver 504 will trip and produce a control output 604 which is passed to control logic 512. Because the offset is too low, control logic 512 will signal counter 514 to increase the count, thus turning on a greater number of transistors 516 and increasing the bias current. In a similar fashion, if the bias current at point 602 is such that greater than 160 mV of offset is present in the different size transistors of receiver 502, then receiver 506 will trip and produce a control output 606. This output causes control logic 512 to send a signal to counter 514 to decrease the count. Decreasing the count allows outputs 574 to switch off any of the switching transistors 516, thus decreasing the bias current available at point 602.

Thus, the differential pair of transistors of receiver 502 may be geometrically drawn at different sizes in order to achieve the desired offset. Variations in the process, temperature, etc., are corrected for by receiving feedback and adjusting a bias current by trial and error. Bias current control circuit 510 may be implemented in other ways. For example, any number of legs for the bias current may be used, and counter 514 may use any number of bits. Also, each leg can represent any amount of current such that a desired bias current can be achieved by switching on or off each of these current legs. In one embodiment, the bias current is adjustable from 10 to 150 uA using the four legs of the current source, each leg switching 10 uA, 20 uA, 40 uA and 80 uA, respectively. Thus, in this fashion a desired built-in offset is achieved within receiver 108*d*.

Although the foregoing invention has been described in some detail for purposes of clarity of understanding, it will be apparent that certain changes and modifications may be practiced within the scope of the appended claims. For instance, the present invention is applicable to any bus where a signal line serves dual duty and a dual receiver would be desired. Also, the implementations for offsets presented are applicable to any receiver where a termination bias voltage is not used, yet an offset is still required for proper communication during arbitration. The dual receiver may also be used alone, or in conjunction with another type of receiver. A common mode reference voltage may also be implemented in other similar fashions to achieve the desired effect. Furthermore, each of the offset embodiments presented use particular logic and circuits that may often be implemented using different circuits that are equivalent. Therefore, the described embodiments should be taken as illustrative and not restrictive, and the invention should not be limited to the details given herein but should be defined by the following claims and their full scope of equivalents.

I claim:

1. A low-voltage differential dual receiver apparatus for receiving a value over a line of a bus not being terminated by a bias voltage, said dual receiver comprising:

a first input signal being received in said dual receiver;

a second input signal being received in said dual receiver and being the complement of said first input signal, said first and second input signals being arranged to transmit said value over said bus line to said dual receiver, wherein said first and second input signals are connected to a common mode reference voltage;

a high-speed differential receiver having said first and second input signals as inputs and arranged to produce said value as a high-speed output during a data phase of said bus, said high-speed differential receiver arranged to communicate with a symmetrical driver on said bus line; and a low-speed differential receiver having said first and second input signals as inputs and arranged to produce said value as a low-speed output during a protocol phase of said bus, said low-speed differential receiver including a voltage offset such that during said protocol phase said bus line enters a known state.

2. A low-voltage differential dual receiver apparatus as recited in claim 1 wherein said line of said bus is a data line, and wherein said high-speed differential receiver is arranged to receive a data value over said data line during said data phase, and wherein said low-speed differential receiver is arranged to receive a protocol value over said data line during said protocol phase.

3. A low-voltage differential dual receiver apparatus as recited in claim 2 wherein said bus is a Small Computer Systems Interface (SCSI) bus.

4. A low-voltage differential dual receiver, comprising:

a first input signal being received in said dual receiver;

a second input signal being received in said dual receiver and being the complement of said first input signal, said first and second input signals being arranged to transmit a value over a bus line to said dual receiver wherein said bus is a Small Computer Systems Interface (SCSI) bus and said first and second inputs are connected to a common mode reference voltage;

a high-speed differential receiver having said first and second input signals as inputs and arranged to produce said value as a high-speed output during a data phase of said bus, said high-speed differential receiver arranged to communicate with a symmetrical driver on said bus line; and a low-speed differential receiver having said first and second input signals as inputs and arranged to produce said value as a low-speed output during a protocol phase of said bus, said low-speed differential receiver including a voltage offset such that during said protocol phase said bus line enters a known state.

5. An integrated circuit including a low-voltage differential dual receiver apparatus as recited in claim 1 for each line of said bus, said integrated circuit further including a low-voltage differential symmetrical driver for each line of said bus.

6. A low-voltage differential dual receiver apparatus for receiving a value over a line of a bus not being terminated by a bias voltage, said dual receiver comprising:

a first input signal being received in said dual receiver;

a second input signal being received in said dual receiver and being the complement of said first input signal, said first and second input signals being arranged to transmit said value over said bus line to said dual receiver;

a high-speed differential receiver having said first and second input signals as inputs and arranged to produce said value as a high-speed output during a data phase of said bus, said high-speed differential receiver arranged to communicate with a symmetrical driver on said bus line; and a low-speed differential receiver having said first and second input signals as inputs and arranged to produce said value as a low-speed output during a protocol phase of said bus, said low-speed differential receiver including a voltage offset such that during said protocol phase said bus line enters a known state, the low-speed differential receiver further includes, a differential receiver circuit having a pair of differential transistors, each of said transistors being implanted with a different implant dosage, whereby said voltage offset is produced between said pair of differential transistors.

7. A bus interface integrated circuit for communicating values over a line of a bus, said bus line not being terminated by a bias voltage, said bus interface integrated circuit comprising:

a bus line arranged to transmit a first signal and to transmit a second signal that is the complement of said first signal, said first and second signals being arranged to communicate values over said bus line, wherein said first and second input signals are connected to a common mode reference voltage;

a low-voltage differential symmetrical driver connected to said bus line and arranged to transmit a first portion of said values over said bus line in a symmetrical fashion;

a low-voltage differential dual receiver connected to said bus line and arranged to receive a second portion of said values over said bus line, said dual receiver including a high-speed receiver having said first and second signals as inputs and arranged to produce said second portion of said values as high-speed outputs during a data phase of said bus, and a low-speed receiver having said first and second signals as inputs and arranged to produce said second portion of said values as low-speed outputs during a protocol phase of said bus, said low-speed receiver including a voltage offset such that during said protocol phase said bus line enters a known state.

8. A bus interface integrated circuit as recited in claim 7 wherein said line of said bus is a data line, and wherein said high-speed receiver is arranged to receive a data value over said data line during said data phase, and wherein said low-speed receiver is arranged to receive a protocol value over said data line during said protocol phase.

9. A bus interface integrated circuit as recited in claim 8 wherein said bus is a Small Computer Systems Interface (SCSI) bus.

10. A low-voltage differential dual receiver apparatus for receiving a value over a line of a bus not being terminated by a bias voltage, said dual receiver comprising:

a first input signal being received in said dual receiver;

a second input signal being received in said dual receiver and being the complement of said first input signal, said first and second input signals being arranged to transmit said value over said bus line to said dual receiver;

a high-speed differential receiver having said first and second input signals as inputs and arranged to produce said value as a high-speed output during a data phase of said bus, said high-speed differential receiver arranged to communicate with a symmetrical driver on said bus line; and a low-speed differential receiver having said first and second input signals as inputs and arranged to produce said value as a low-speed output during a protocol phase of said bus, said low-speed differential receiver including a voltage offset such that during said protocol phase said bus line enters a known state, wherein said line of said bus is a data line, and wherein said high-speed differential receiver is arranged to receive a data value over said data line during said data phase, and wherein said low-speed differential receiver is arranged to receive a protocol value over said data line during said protocol phase.

* * * * *